US 6,569,746 B2

(12) United States Patent
Lee et al.

(10) Patent No.: US 6,569,746 B2
(45) Date of Patent: May 27, 2003

(54) METHODS OF FORMING INTEGRATED CIRCUIT CAPACITORS HAVING ELECTRODES THEREIN THAT COMPRISE CONDUCTIVE PLUGS

(75) Inventors: Hyae-Ryoung Lee, Youngin (KR); Sun-Il Yu, Koyang (KR); Dong-Woo Kim, Sungnam (KR)

(73) Assignee: Samsung Electronics Co., Ltd. (KR)

(*) Notice: Subject to any disclaimer, the term of this patent is extended or adjusted under 35 U.S.C. 154(b) by 70 days.

(21) Appl. No.: 09/733,716

(22) Filed: Dec. 8, 2000

(65) Prior Publication Data

US 2001/0002722 A1 Jun. 7, 2001

Related U.S. Application Data

(62) Division of application No. 09/177,421, filed on Oct. 22, 1998, now Pat. No. 6,184,551.

(30) Foreign Application Priority Data

Oct. 30, 1997 (KR) ............................................. 97-56439
Aug. 14, 1998 (KR) ............................................. 98-33085

(51) Int. Cl.$^7$ ............................................. H01L 21/20
(52) U.S. Cl. ....................... 438/398; 438/396; 438/397; 438/399
(58) Field of Search ................................. 438/398, 396, 438/397, 399

(56) References Cited

U.S. PATENT DOCUMENTS

| 5,406,447 A | 4/1995 | Miyazaki .................... 301/313 |
| 5,536,672 A | 7/1996 | Miller et al. .................. 437/52 |
| 5,563,762 A | 10/1996 | Leung et al. ............. 361/301.4 |
| 5,580,814 A | 12/1996 | Larson ......................... 437/52 |
| 5,627,391 A | 5/1997 | Shimada et al. ............ 257/310 |
| 6,177,351 B1 * | 1/2001 | Beratan et al. ............. 438/694 |
| 6,278,172 B1 * | 8/2001 | Tominaga ................... 257/535 |

* cited by examiner

Primary Examiner—David Nelms
Assistant Examiner—Reneé R Berry
(74) Attorney, Agent, or Firm—Myers Bigel Sibley & Sajovec

(57) ABSTRACT

Disclosed is a capacitor of semiconductor integrated circuit and a method for fabricating the same by which characteristic of a capacitor and bit resolution can be improved to thereby obtain an improved analog device of high accuracy. The capacitor of semiconductor integrated circuit includes a conductive lower electrode formed on a predetermined portion of an insulating substrate, an insulating layer formed on the insulating substrate including the conductive lower electrode and provided with a via hole so that the surface of the lower electrode is exposed in its predetermined portion, a dielectric layer formed on the insulating layer and in the via hole, and an conductive upper electrode formed on the predetermined portion of the dielectric layer including the via hole to have a piled structure such as "conductive plug/conductive layer pattern".

21 Claims, 4 Drawing Sheets

METHODS OF FORMING INTEGRATED CIRCUIT CAPACITORS HAVING ELECTRODES THEREIN THAT COMPRISE CONDUCTIVE PLUGS

This application is a divisional of prior application Ser. No. 09/177,421, filed Oct. 22, 1998, now U.S. Pat. No. 6,184,551 the disclosure of which is hereby incorporated herein by reference.

BACKGROUND OF THE INVENTION

1. Field of the Invention

The present invention relates to a capacitor of semiconductor integrated circuit and method for fabricating the same, and more particularly to a capacity of semiconductor integrated circuit having a structure of a metal insulator metal (MIM) type which is applied to a logic circuit or an analog circuit and a method for fabricating the same.

2. Description of Related Art

A conventional semiconductor integrated circuit is classified in response to a signal process mode as a digital type of integrated circuit (what is called a logic circuit) in which an output signal is changed to an on/off type by a variation of input signal and an analog type of integrated circuit (what is called an analog circuit) in which an output signal linearly varies with a variation of input signal.

Since the above-mentioned integrated circuits serve to memorize information in response to whether or not charge in capacitor is present without distinction between a digital type and an analog type, in order to maintain normal operation characteristic of the circuits, a capacitor must be fabricated lest its capacitance vary with the variation of temperature or voltage while its device is manufactured.

FIG. 1 shows a cross sectional view for illustrating a capacitor structure of a conventional logic circuit or analog circuit having a gate linear width of 0.5 μm which has been commonly applied when the integrated circuit is manufactured.

Referring to FIG. 1, in the conventional PIP-type capacitor of logic or analog circuit, field oxide layer (not shown) formed on the semiconductor substrate 10 is formed thereon with a lower electrode 12 made of polysillicon, on which dielectric layer 14 having an ON structure (for exaple, buffer oxide layer 14a/nitride layer 14b) is formed, and the dielectric layer 14 is formed thereon with an upper electrode 18 made of polycide and having a line width narrower than that of the lower electrode 12.

However, in case the capacitor of a logic or analog circuit is formed in the PIP type structure mentioned in the above, the following problem is occured.

Since the PIP type capacitor shown in FIG. 1 has the voltage coefficient of capacitance (VCC) of about 220 part per million/V (ppm) and temperature coefficient of capacitance (TCC) of about 120 ppm/C, there are problems in that a variation of the capacitance caused by a variation of voltage or temperature is increased, thereby a distribution variation of capacitance is increased as well as bad array matching characteristics appears.

Furthermore, in case the capacitor having capacitance characteristics mentioned in the above is used in a high frequency band, semiconductor integrated circuit cannot be normally operated in a stable state because resistance of polysilicon forming electrodes of capacitor is high.

To solve the problems, recently, there is a tendency to adapt the MIM structure instead of PIP structure to a capacitor when logic or analog circuit is designed. For example, as shown in FIG. 2, U.S. Pat. No. 5,406,447 discloses the MIM-type capacitor of the conventional logic or analog circuit.

Referring to FIG. 2, in the conventional MIM-type capacitor, a semiconductor substrate 20 is formed thereon with an isolation oxide film 22, the isolation oxide film 22 is formed on its predetermined portion with a lower electrode 24 made of conductive material, the lower electrode 24 is formed on its predetermined portion with a dielectric film 28 made of oxide, where a first barrier metal film 26 is formed therebetween, an intermediate film 30 is formed on the respective films, the intermediate ioslation film 30 is formed therein with via holes so that the surface of the dielectric film 28 is exposed in its predetermined portion, and the intermediate film 30 is formed thereon with a second barrier metal film 32 which is formed thereon with an upper electrode 34 made of conductive material.

Such capacitor having a MIM-type structure can be more stably operated in a high frequency band than a PIP-type capacitor. In this case, however, the following problem is occured because it is difficult to monitor when etch is completted during the formation of via holes.

Since the intermediate isolation film 30 is commonly formed with about 10,000 Å in thickness, 30 to 40% of the thickness in the lower film is over-etched during the formation of the via holes. Accordingly, in case the MIM-type capacitor is manufactured so as to have the structure mentioned in the above, the dielectric film 28 is also partly etched when the intermediate isolation film 30 is etched. At this time, since it is difficult to detect how much the dielectric film 28 is over-etched and accordingly thickness of the dielectric film 28 cannot be revived in the same manner, there is a problem in that the VCC value and TCC value become increased due to the variation of capacitance.

In order to solve the problem, the capacitor must be manufactured so that the dielectric film is thicker than that of the conventional dielectric film, or a separate film which can be used as a dielectric film as well as etch-stopper is further formed on the dielectric film 28, thereby the over-etch of the dielectric film 30 may be prevented during the etch of the intermediate isolation film 30. However, in case the dielectric film becomes thicker, since the capacitance becomes decreased, there is a problem in that the chip size must be increased. In case the additional film is formed, there is a problem in that material which can be used as a dielectric film and etch-stopper has not yet been developed. Therefore, the two methods cannot be applied at present time.

In case VCC and TCC values become increased, bad characteristics of capacitor is caused thereby and bad operation of analog circuits is accordingly caused. In some cases, lowered bit resolution prevents high performance of analog circuits from being realized.

SUMMARY OF THE INVENTION

It is an object of the invention to provide a capacitor of semiconductor integrated circuit in which a MIM structure is formed by utilizing metal which is stable in its conductivity characteristics, and a method for manufacturing the capacitor which evaporation for dielectric film is performed in a state that via holes are formed, thereby characteristics of the capacitor is improved by increasing bit resolution, and as a result, the capacitor can be normally operated even in a high frequency band.

It is another object of the invention to provide a method for effectively manufacturing the capacitor of the semiconductor integrated circuit.

In order to achieve the above-mentioned object, in accordance with one embodiment of the present invention, there is provided a capacitor of a semiconductor integrated circuit comprising a lower electrode made of conductive material formed on a predetermined portion of insulating substrate; insulating layer formed on the insulating substrate including the lower electrode and provided with a via hole so that surface of the lower electrode is exposed in its predetermined portion; and a dielectric layer formed on the insulating layer and in the via hole; an upper electrode formed on a predetermined portion of the dielectric layer including the via hole and having a piled-up layer structure such as "conductive plug/conductive layer pattern".

At this time, the capacitor may have a structure that anti-reflection layers are further formed on the lower electrode and upper electrode respectively, or that a metal barrier layer is further formed on the lower surface of the lower electrode and between the conductive plug of the upper electrode and the conductive layer pattern or on the lower surface of the conductive plug, or that the conductive plug connected to the lower electrode is further formed within the insulating substrate below the lower electrode.

In order to achieve the another object, the present invention provides a method for manufacturing a capacitor of a semiconductor integrated circuit, comprising the steps of: forming a first conductive layer on an insulating substrate; selectively-etching the first conductive layer to form on the substrate a first wiring line and lower electrode at the same time; forming an insulating layer on the substrate including the first wiring line and lower electrode; selectively-etching the insulating layer in order for the predetermined portion of the surface of the lower electrode to be exposed to thereby form a first via hole; forming a dielectric film on the insulating film and in the first via hole; selectively-etching the insulating film and the dielectric film so that the surface of the first wiring line is exposed in its predetermined portion to form a second via hole in the insulating film; forming a conductive plug in the first and second via holes; forming a second conductive film on the dielectric film including the conductive plug; and etching the second conductive film to form a second wiring line connected to the conductive plug within the second via hole and an upper electrode having a heaped-up structure of "conductive plug/conductive layer pattern" simultaneously.

At this time, it is preferable that a step of forming an anti-reflection layer and a metal barrier layer is further added before and after forming the first conductive layer and second conductive layer. It is desirable that a RF etch process is further added after forming of the first via hole for the purpose to eliminate by-products resulting from the process of etching the insulating layer. The RF etch process continues until by-products resulting from the etch process are eleminated by as much as 100 to 400 Angstrom (Å), and can be performed after forming of the second via hole or the conductive plug. Also, in the present invention, a conductive plug is further provided within the insulating substrate below the lower electrode, as a result, the lower electrode and conductive plug can be electrically connected to each other during the procedure.

In case of forming the capacitor of the semiconductor integrated circuit (for example, logic circuits or analog circuits) so as to have the above-mentioned structure, since evaporation for dielectric layer is formed in a state that via holes are formed, over-etch of the dielectric layer can be prevented during the etch of the intermediate isolation layer for forming the first via hole. As a result, a large variation of capacitance in response to the variation of voltage or temperature can be prevented.

BRIEF DESCRIPTION OF THE DRAWINGS

The present invention may be better understood, and its numerous objects, features, and advantages made apparent to those skilled in the art by reference to the accompanying drawings, in which the use of the same reference symbols in different drawings indicates similar or identical items.

DETAILED DESCRIPTION OF THE PREFERRED EMBODIMENT(S)

In the present invention, a capacitor is simply constructed by logic circuits or analog circuits so as to have a MIM structure in such a manner that processes for forming a first via hole(s) and dielectric layer(s) are additionally performed while multi-layered wiring is formed in a semiconductor integrated circuit, thereby resulting in improving characteristic of capacitor even without complex processes being added.

Figure 1:
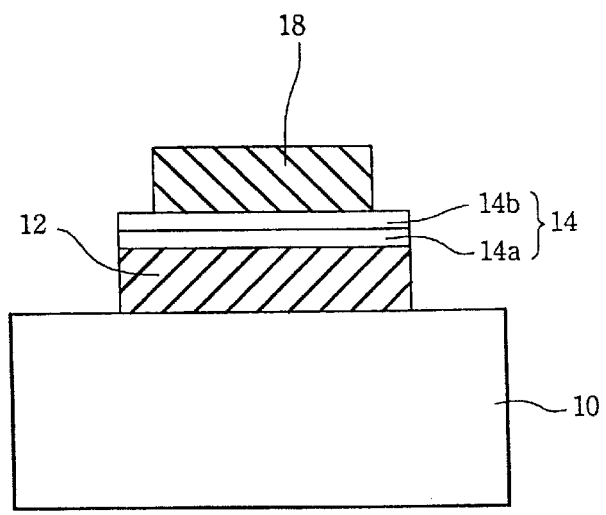
FIG. 1 shows a cross sectional view for illustrating a PIP-type capacitor structure which is utilized in a logic circuit or analog circuit according to the prior art.
Figure 2:
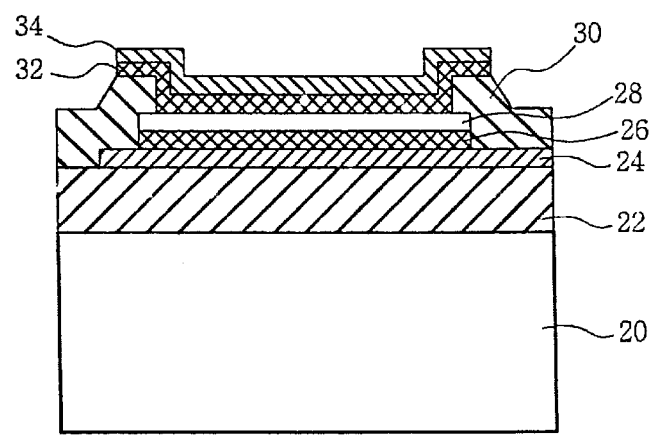
FIG. 2 shows a cross sectional view for illustrating a MIM-type capacitor structure which is utilized in a logic circuit or analog circuit according to the prior art.
Figure 3:
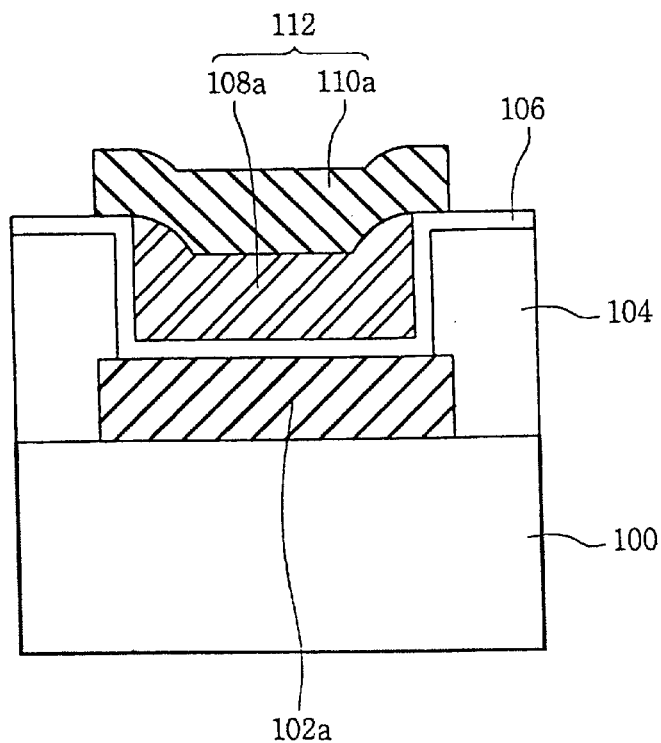
FIG. 3 shows a cross sectional view for illustrating a MIM-type capacitor structure which is utilized in a logic circuit or analog circuit according to the present invention.

Referring to FIG. 3, the capacitor having analog circuits or logic circuits according to the present invention comprises a lower electrode 102a made of a conductive material (for example, Al-based or Cu-based alloy) formed on a predetermined part of the insulating substrate 100, a dielectric layer 106 formed on the lower electrode 102a, and an upper electrode 112 formed on the dielectric layer 106 with a deposition layer structure such as "conductive plug 108a/ conductive film pattern 110a". The capacitor constructed thus has a MIM structure, as a whole. Reference numeral 104 indicates insulating layers formed therebetween. The conductive layer for forming the lower electrode 102a and the conductive layer pattern 110a for forming the upper electrode 112 are formed with an Al-based alloy or Cu-based alloy, and the conductive plug 108a for forming the upper electrode 112 is formed with a w-based alloy or Al-based aloy or Cu-based alloy.

At this time, the capacitor may has additional barrier metal layers (not shown) being formed between the insulating substrate 100 and the lower electrode 102a, between the conductive plug 108a and the conductive pattern 110a, and on the lower surface of the conductive plug 108a, respectively. Also, the capacitor may be provided with an additional anti-reflection layers (not shown) on the lower electrode 102a and the upper electrode 112, respectively.

Furthermore, if the insulating substrate 100 is provided below the lower electrode 102a with a conductive plug, it is possible to manufacture the capacitor so as to have such structure as the lower electrode is electrically connected to the conductive plug.

Accordingly, such capacitor can be manufactured through the following five steps. With reference to FIGS. 4a to 4e, the processes will now be explained as follows.

Figure 4A:
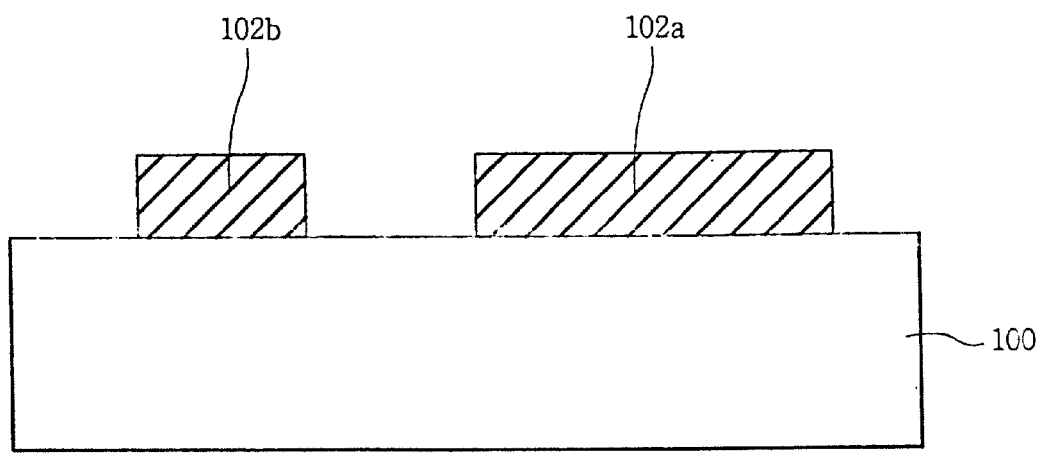
FIGS. 4a to 4e show cross sectional views for illustrating various steps of a method which is for manufacturing a capacitor shown in FIG. 3.

As a first step, as shown in FIG. 4a, a first cnductive layer made of Cu-based alloy or Al-based alloy is formed on the insulating substrate 100, thereafter both the first wiring line 102b and lower electrode 102a are simultaneously formed on the substrate 100 by etching the first conductive layer through a photosensitive film pattern (not shown) as a mask which limits the capacitor-formed portion and the wiring line-formed portion. At this time, it can be possible to proceed its process so that the separate conductive plug may be electrically connected to the lower electrode 102a by providing within the insulating substrate 100 below the lower electrode 102a with an additional separate condutive plug which is made of W-based alloy or Al-based alloy or Cu-based alloy.

And, in order to improve patterning characteristic for the quality of a film (layer) and lower the contact resistance between the insulating substrate 100 and the lower electrode 102a, the process for forming the first wiring line 102b and lower electrode 102a can be performed in such a manner that in a state the metal barrier layer (not shown) and the conductive layer and anti-reflection layer (not shown) are formed in order thereof, they are etched by utilizing the photosensitive pattern, which limits the capacitor-formed portion and the wiring line-formed portion, as a mask. At this time, the barrier metal layer and the anti-reflection layer are formed in a shape of single layer of Ti, Ta, W, Mo, TiN, TiW, TaN, MoN, W—N, W—Si—N, Ta—Si—N, W—B—N and Ti—Si—N, or in a shape of deposited layers by combination thereof.

Figure 4B:
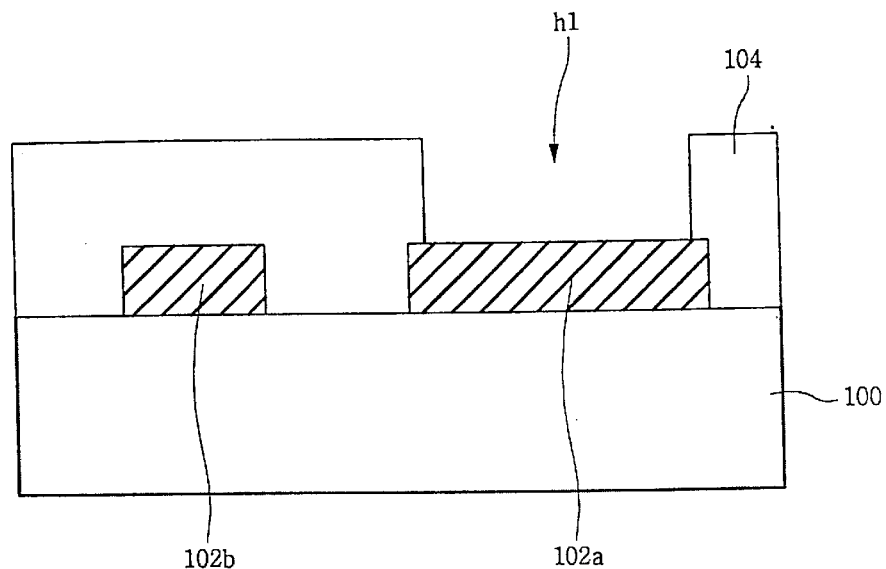

As a second step, as shown in FIG. 4b, the insulating layer 104 is formed on the insulating substrate 100 including the first wiring line 102b and lower electrode 102a, thereafter the first via hole (h1) is formed within the insulatng layer 104 by selectively-etching the lower electrode 102a so that its surface is exposed in a predetermined portion.

At this time, in case the anti-reflection layer is formed on the lower electrode 102a, the etching process can be performed so that the anti-reflection layer is eleminated while etching the insulating layer, whereas the etch process can be performed so that the anti-reflection layer remains on the lower electrode 102a by etching the insulating layer 104 only for the purpose of improving flatness of the surface of the lower electrode 102a.

Figure 4C:
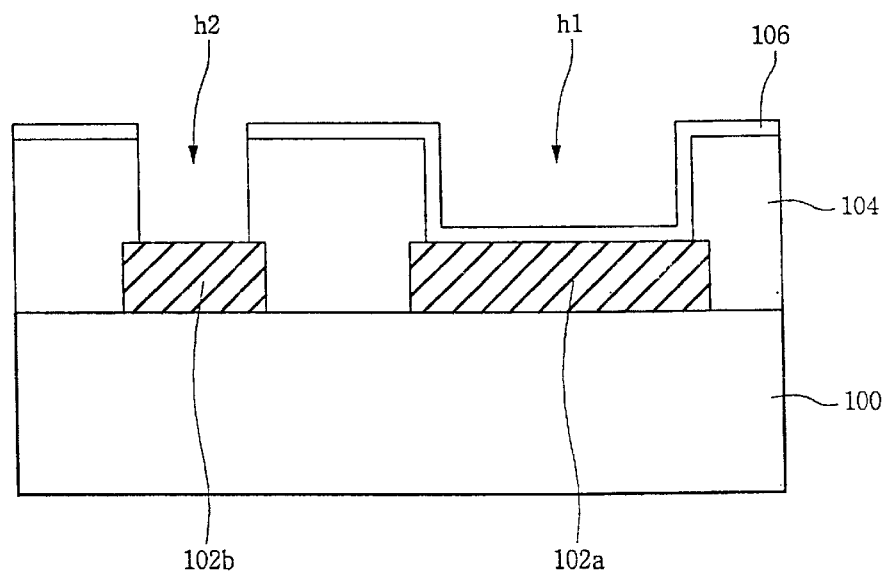

As a third step, as shown in FIG. 4c, the dielectric layer 106 is formed bu utilizing a CVD method on the insulating layer 104 and in the first via hole h1, thereafter a second via hole h2 is formed within the insulating layer 104 by selectively-etching the dielectric layer and the insulating layer 104 so that the surface of the wiring line 102b is partly exposed in a predetermined portion. The dielectric layer 106 is mainly formed with a single layer of one of P-TEOS (Plasma Tera Ethyl Ortho Silicate), PEOX (Plasma Enchanced Oxide), PESiN (Plasma Enchanced nitride), HDP (High Density Plasma), $Ta_2O_5$, SOG (Spin On Glass), $O_3$-TEOS, BST(Ba, Sr)$TiO_3$ and PZT (Lead Zirconium Titanate), or a deposited layer by combination thereof.

Figure 4D:
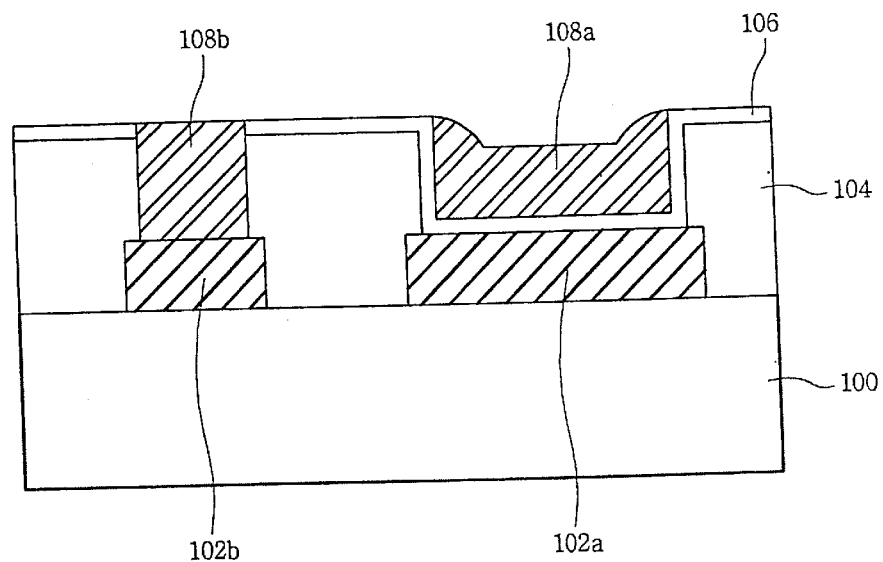

As a fourth step, as shown in FIG. 4d, a conductivity layer which consists of material such as W—Al based alloy, Cu based alloy and the like is formed on the dielectric layer 106 including the first via hole h1 and second via hole h2 by utilizing the CVD method, thereafter the conductive plugs 108a and 108b are respectively formed within the first and second via hole h1 and h2 by flattening it through CMP process or etch-back process. At this time, in case the conductive plugs 108a and 108b are made of W, in order to prevent W-lifting and at the same time improve the quality of the evaporated film (layer), it must be further provided the metal barrier layer (not shown) having a structure of single layer which consists of one of Ti, Ta, W, Mo, TiN, TiW, TaN, MoN, W—N, W—Si—N, Ta—Si—N, W—B—N and Ti—Si—N, or a structure of deposited layers by combination thereof.

Figure 4E:
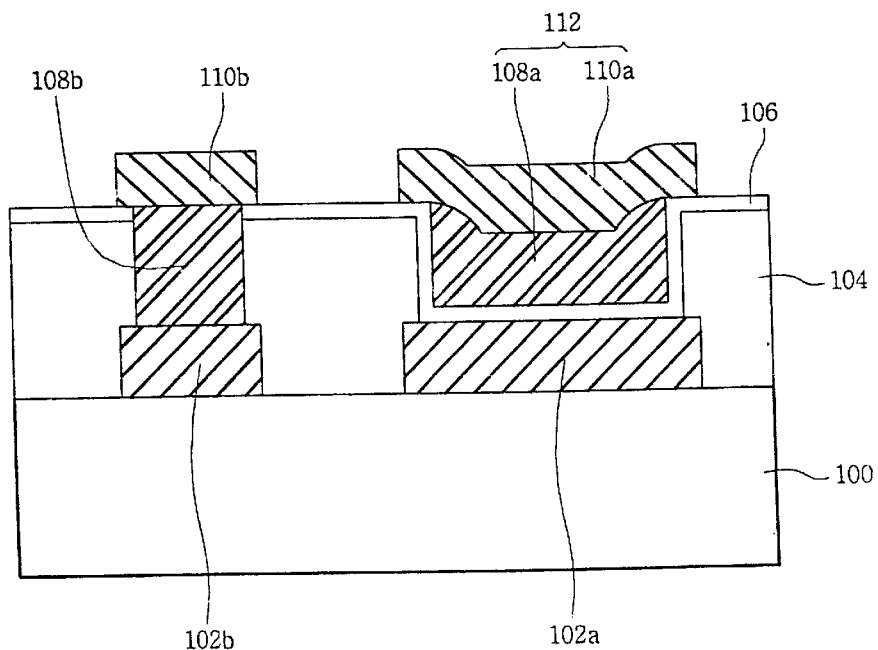

As a fifth step, as shown in FIG. 4e, a second conductive layer which consists of Al based alloy or Cu based alloy is formed on the dielectric layer 106 including the conductive plugs 108a and 108b, thereafter a second wiring line 110b and conductive layer pattern 110a are formed by etching the second conductive layer by utilizing the photosensitve layer pattern (not shown) as a mask, which limits the capacitor-formed portion and the wiring line-formed portion and the processes are completed. At this time, the conductive layer pattern 110a is formed so as to have a line width broader than that of the conductive plug 108a formed within the first via hole.

As a result, the insulating substrate 100 is formed on and below the conductive plug 108b with the first and second wiring lines 102b and 110b respectively, and on the other side thereof the insulating layer 100 is formed thereon with the lower electrode 102a made of conductive material and the upper electrode having a "conductive plug 108a/ conductive layer pattern 110a" type of structure which the dielectric layer 106 is formed therebetween, thereby forming a capacitor having a MIM structure as a result.

In this case, the second wiring line 110b and the conductive layer pattern 110a forming processes can be also performed in such a manner that the barrier metal layer (not shown), second conductive layer and anti-reflection layer are formed in order thereof on the dielectric layer 106 including the conductive plugs 108a and 108b in order to improve the film-quality patterning characteristic and at the same time to lower the contact resistance to thereafter be etched in order thereof by utilizing the photosensitive film pattern (not shown) as a mask, which limits the capacitor-formed portion and wiring line-formed portion.

In case manufacturing a capacitor of semiconductor integrated circuit since the dielectric layer 106 is evaporated in a state that the first vial hole h1 is formed, over-etch of the dielectric layer can be prevented during the etch of the dielectric layer 104 for forming the first via hole. As a resut, the variation of capacitance in response to the variation of voltage or temperature can be minimized, thereby bit resolution can be improved, and diffusion characteristics of capacitance and array-matching characteristics of the capacitor are improved as well.

Meanwhile, the process for maunufacturing the capacitor having a MIM structure according to another embodiment can be performed in such a manner that the first via hole h1 is formed, and thereafter RF (radio frequency) etch process (or wet etch process or dry etch process) is further performed before dielectric layer is formed. As a result, by-products (for example, insulating materials such as polymer, $Al_2O_3$, TiON and the like) produced while the insulating layer is etched can be entirely eleminated to improve the flatness of the surface of the lower electrode 102a. At this time, RF etch process is performed so that by-products produced by etching can be eleminated by as much as 100 to 400 Angstrom (Å), and the RF etching process can be applied in the same manner even after the second via hole h2 is formed or even after the conductive plugs 108a and 108b are formed within the first and second via holes h1 and h2.

According to the present invention as described in the above, since the dielectric layer is evaporated in a state that the first via hole is formed when the capacitor of analog or logic circuits, (1) a large variation of capacitance in response to the variation of temperature or voltage can be prevented, thereby bit resolution is increased and diffusion characteristics of capacitance and array-matching characteristics of the capacitor are improved, (2) the process for froming the dielectric film is performed in a state that flatness of the surface of the lower electrode is improved by utilizing the the RF-etch process, thereby poor quality capacitors can be reduced.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A method of forming an integrated circuit device, comprising the steps of:

forming a barrier metal layer on an integrated circuit substrate;

forming a first electrically conductive layer that extends on the barrier metal layer;

selectively etching the first electrically conductive layer to define a first wiring line and a lower capacitor electrode;

forming an electrically insulating layer that extends on the first wiring line and on the lower capacitor electrode that is separate from the first wiring line;

patterning the electrically insulating layer to define a first contact hole therein that exposes an upper surface of the lower capacitor electrode;

forming a capacitor dielectric layer that extends on the electrically insulating layer and on the upper surface of the lower capacitor electrode;

selectively etching the capacitor dielectric layer and the electrically insulating layer in sequence to define a second contact hole that exposes an upper surface of the first wiring line; and forming first and second electrically conductive plugs in the first and second contact holes, respectively.

2. The method of claim 1, wherein said step of selectively etching the first electrically conductive layer comprises selectively etching the first electrically conductive layer and the barrier metal layer in sequence.

3. A method of forming an integrated circuit device, comprising the steps of:

forming a first electrically conductive layer on an integrated circuit substrate;

selectively etching the first electrically conductive layer to define a first wiring line and a lower capacitor electrode that is separate from the first wiring line;

forming an electrically insulating layer that extends on the first wiring line and on the lower capacitor electrode;

patterning the electrically insulating layer to define a first contact hole therein that exposes an upper surface of the lower capacitor electrode;

forming a capacitor dielectric layer that extends on the electrically insulating layer and on the upper surface of the lower capacitor electrode;

selectively etching the capacitor dielectric layer and the electrically insulating layer in sequence to define a second contact hole that exposes an upper surface of the first wiring line;

forming first and second electrically conductive plugs in the first and second contact holes, respectively; and forming a barrier metal layer directly on the first conductive plug.

4. The method of claim 3, wherein said step of forming a barrier metal layer is followed by the steps of:

forming a second electrically conductive layer on the barrier metal layer; and selectively etching the second electrically conductive layer and the barrier metal layer in sequence to define an upper capacitor electrode extending opposite the first conductive plug and a second wiring line extending opposite the second conductive plug.

5. A method of forming an integrated circuit device, comprising the steps of:

forming a first electrically conductive layer on an integrated circuit substrate;

selectively etching the first electrically conductive layer to define a first wiring line and a lower capacitor electrode that is separate from the first wiring line;

forming an electrically insulating layer that extends on the first wiring line and on the lower capacitor electrode;

patterning the electrically insulating layer to define a first contact hole therein that exposes an upper surface of the lower capacitor electrode;

forming a capacitor dielectric layer that extends on the electrically insulating layer, on sidewalls of the first contact hole and on the upper surface of the lower capacitor electrode;

selectively etching the capacitor dielectric layer and the electrically insulating layer in sequence to define a second contact hole that exposes an upper surface of the first wiring line;

forming first and second electrically conductive plugs in the first and second contact holes, respectively; and forming an upper capacitor electrode on the first electrically conductive plug.

6. The method of claim 5, wherein the first electrically conductive layer aluminum alloy or comprises an a copper alloy.

7. The method of claim 5, wherein the integrated circuit substrate comprises a conductive plug therein; and wherein the lower capacitor electrode is electrically coupled to the conductive plug.

8. The method of claim 6, wherein the first electrically conductive plug comprises a tungsten-aluminum alloy or a copper alloy.

9. The method of claim 6, wherein the first electrically conductive plug comprises tungsten; and wherein said step of forming first and second electrically conductive plugs is preceded by the step of forming a barrier metal on the capacitor dielectric layer.

10. The method of claim 9, wherein the barrier metal layer comprises a material selected from the group consisting of Ti, Ta, W, Mo, TiN, TaN, MoN, WN, WSIN, TaSiN, WBN, TiSIN or combinations thereof.

11. The method of claim 5, wherein the upper capacitor electrode comprises an aluminum alloy or a copper alloy.

12. The method of claim 5, wherein the capacitor dielectric layer comprises a material selected from the group consisting of P-TEOS, PEOX, PESiN, HDP, Ta$_2$O$_5$, SOG, O$_3$-TEOS, BST and PZT.

13. The method of claim 5, further comprising the step or forming an antireflection layer on an upper surface of the first electrically conductive layer.

14. The method of claim 13, wherein said step of forming an antireflection layer precedes said step of selectively etching the first electrically conductive layer to define a first wiring line and a lower capacitor electrode.

15. The method of claim 5, further comprising the step of forming an antireflection layer on the upper capacitor electrode.

16. The method of claim 13, wherein the antireflection layer comprises a material selected from the group consisting of Ti, Ta, W, Mo, TiN, TaN, MoN, WN, WSIN, TaSiN, WBN, TiSiN or combinations thereof.

17. The method of claim 13, wherein said step of forming a capacitor dielectric layer comprises forming a capacitor dielectric layer on the antireflection layer.

18. The method of claim 15, wherein said step of forming first and second electrically conductive plugs in the first and second contact holes comprises:

depositing an electrically conductive plug layer into the first and second contact holes; and planarizing the electrically conductive plug layer using a chemical-mechanical polishing process or an etch-back process.

19. The method of claim 5, wherein said step of forming a capacitor dielectric layer is preceded by the step of cleaning the first contact hole using an RF etch process, a wet etch process or a dry etch process.

20. The method of claim 5, wherein said step of forming first and second electrically conductive plugs is preceded by the step of cleaning the second contact hole using an RF etch process, a wet etch process or a dry etch process.

21. The method of claim 5, wherein said step of forming an upper capacitor electrode is preceded by the step of cleaning the first and second electrically conductive plugs using an RF etch process, a wet etch process or a dry etch process.

* * * * *